United States Patent
Mollat et al.

(10) Patent No.: US 7,415,378 B2
(45) Date of Patent: Aug. 19, 2008

(54) METHODS FOR ANALYZING CRITICAL DEFECTS IN ANALOG INTEGRATED CIRCUITS

(75) Inventors: Martin B. Mollat, McKinney, TX (US); Milind V. Khandekar, Plano, TX (US); Tony T. Phan, Flower Mound, TX (US); Kyle M. Flessner, Richardson, TX (US)

(73) Assignee: Texas Instruments incorporated, Dallas, TX (US)

( * ) Notice: Subject to any disclaimer, the term of this patent is extended or adjusted under 35 U.S.C. 154(b) by 399 days.

(21) Appl. No.: 11/048,027

(22) Filed: Jan. 31, 2005

(65) Prior Publication Data

US 2006/0171221 A1 Aug. 3, 2006

(51) Int. Cl.
*G06F 19/00* (2006.01)
(52) U.S. Cl. .................. 702/117; 702/118
(58) Field of Classification Search .......... 324/501, 324/527, 753; 702/38, 40, 59, 117, 118, 702/172, 182; 714/40, 740, 745; 356/237.3
See application file for complete search history.

(56) References Cited

U.S. PATENT DOCUMENTS

| | | | |
|---|---|---|---|
| 5,285,143 A * | 2/1994 | Bahr et al. ............... 318/805 |
| 5,844,850 A * | 12/1998 | Tsutsui et al. ............... 365/200 |
| 6,185,707 B1 | 2/2001 | Smith et al. |
| 6,496,958 B1 * | 12/2002 | Ott et al. ....................... 716/4 |
| 6,950,771 B1 * | 9/2005 | Fan et al. .................... 702/117 |
| 6,960,807 B2 * | 11/2005 | Pendharkar ................. 257/336 |
| 2006/0105475 A1 * | 5/2006 | Ciplickas et al. ............. 438/14 |

OTHER PUBLICATIONS

Oheletz, M; "Realistic Faults Mapping Scheme for the Fault Simulation of Integrated Analogue CMOS Circuits"; Proceedings International Test Conference 1996; Oct. 20-25, 1996; pp. 776-785.*
Pendharkar, S; Winterhalter, C; Trivedi, M; Li, H; Kurnia, A; Divan, D; Shenai, K; "Test Circuits for Verification of Power Device Models"; 30th IEEE Industry Applications Conference 1995; vol. 2; Oct. 8-12, 1995; pp. 1055-1060.*
KLA-Tencor Website; Assorted archived pages of Dec. 2004.*

* cited by examiner

*Primary Examiner*—John E. Barlow, Jr.
*Assistant Examiner*—Douglas N Washburn
(74) *Attorney, Agent, or Firm*—W. James Brady, III; Frederick J. Telecky, Jr.

(57) ABSTRACT

The present invention provides a method for analyzing critical defects in analog integrated circuits. The method for analyzing critical defects, among other possible steps, may include fault testing a power field effect transistor (120) portion of an analog integrated circuit (115) to obtain electrical failure data. The method may further include performing an in-line optical inspection of the analog integrated circuit (115) to obtain physical defect data, and correlating the electrical failure data and physical defect data to analyze critical defects.

20 Claims, 4 Drawing Sheets

METHODS FOR ANALYZING CRITICAL DEFECTS IN ANALOG INTEGRATED CIRCUITS

TECHNICAL FIELD OF THE INVENTION

The present invention is directed, in general, to a method for testing integrated circuits and, more specifically, to a method for detecting critical defects in analog integrated circuits.

BACKGROUND OF THE INVENTION

Semiconductor chips may be divided into a number of different discrete categories, analog, digital, and memory devices, depending on the characterization. To accommodate the increasingly stringent requirements of today's semiconductor industry, analog, digital and memory devices often require production monitoring and testing. Production monitoring is typically performed using "in-line" inspection equipment, and production testing is performed using "end-of-line" test equipment. In-line inspection equipment often inspects entire semiconductor wafers, each of which may have formed thereon hundreds of chips. End-of-line test equipment performs "electrical testing" on semiconductor wafers in which the pads of chips are contacted and the chips "exercised."

Apart from production testing is failure analysis. Failure analysis attempts to identify the cause of failures of chips of a particular chip design after those failures have been detected during production (or prototype) testing. Failure analysis may typically acquire more detailed failure information than that provided using the production (or prototype) testing.

Digital and memory devices, because of their structure as regular arrays of memory cells, readily lend themselves to end-of-line production testing. The memory cells of the digital and memory devices may be tested by performing a series of read and write operations to the memory cells. Errors in read/write testing may be pinpointed as likely physical defects at readily identifiable locations on the chip. Alternatively, the digital and memory devices' designs may contain built-in self-test (BIST) capabilities. In either case, functional test results can be "bitmapped" to failure locations on the memory chip. In memory bitmapping, electrical failures are localized within a relatively small physical "trace" on the die.

Unfortunately, analog devices have little or no memory cells to accurately discern defect origins like their digital and memory device counterparts. Current and historic work to capture defect loss for analog devices is relegated to using test chips. The information discerned from the test chips, however, must then be attributed (e.g., extrapolated) to represent the actual product wafers. Thus, the information discerned is not one to one, because what you detect in a test chip may or may not be present in a production chip. Moreover, running test chips is expensive and takes away from resources that might be used to make production chips.

Accordingly, what is needed in the art is a technique for an end-of-line production testing methodology for analog devices with the ability to map & overlay physical defect information.

SUMMARY OF THE INVENTION

To address the above-discussed deficiencies of the prior art, the present invention provides a method for analyzing critical defects in analog integrated circuits, and a system for accomplishing the same. The method for analyzing critical defects, among other possible steps, may include fault testing a power field effect transistor portion of an analog integrated circuit to obtain electrical failure data. The method may further include performing an in-line optical inspection of the analog integrated circuit to obtain physical defect data, and correlating the electrical failure data and physical defect data to analyze critical defects.

As previously mentioned, the present invention further includes a system for analyzing critical defects in analog integrated circuits. Among other elements, the system includes: 1) a fault testing subsystem configured to test a power field effect transistor portion of an analog integrated circuit to obtain electrical failure data, 2) an optical inspection subsystem configured to perform an in-line optical inspection of the analog integrated circuit to obtain physical defect data, and 3) a correlation subsystem configured to correlate the electrical failure data and physical defect data to analyze critical defects.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention is based at least in part on the unique acknowledgement that analog based integrated circuits, and particularly their physical and electrical layout, are amenable to product wafer critical defect analysis thereof. Critical defect analysis, as referred to herein, is intended to encompass the process of discerning defects that cause a circuit to fail from defects that do not cause a circuit to fail. Heretofore, the semiconductor industry was unaware of the ability to conduct product wafer critical defect analysis testing on analog based integrated circuits, and thus relied upon test chip critical defect testing. The present invention has recognized, however, that the physical and electrical layout of the power field effect transistor (power FET) portion of the analog integrated circuits lends itself to a pass/fail fault analysis of the individual power FETs. This fault analysis may then, after a number of different optional and required processing steps, be compared to physical defect data, for example from particles, obtained performing an in-line optical inspection of the analog integrated circuit. In turn, the comparison of the data provides a detailed analysis of the critical defects, for example as to their type, size, location, cause, number of defects linked to a particular manufacturing process, etc. Advantageously, the detailed analysis allows one or all of the faulty manufacturing processes to be corrected, whether randomly or based upon importance, for subsequent wafers in subsequent lots.

Figure 1:
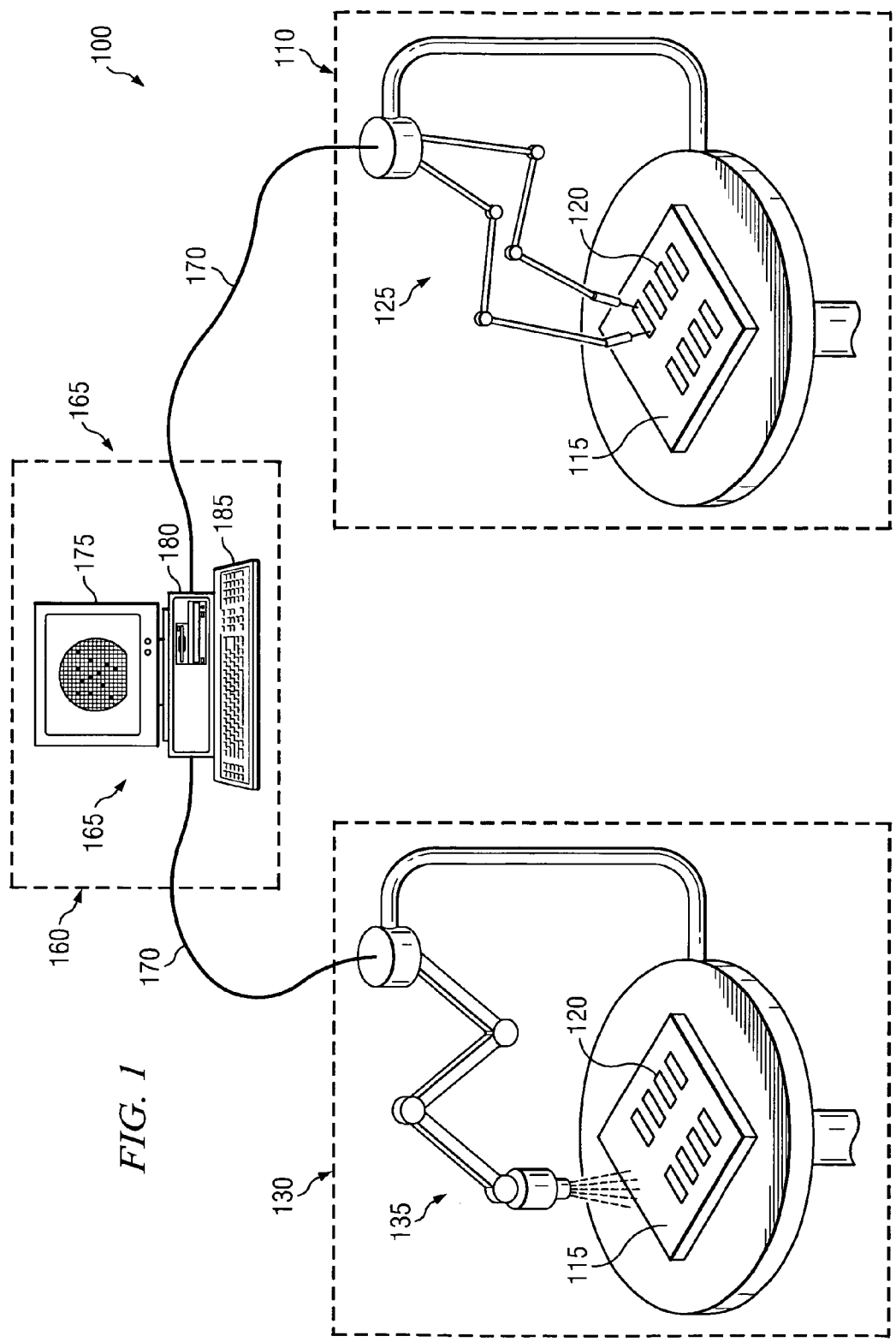
FIG. 1 illustrates a partial sectional view of an exemplary embodiment of a system for detecting critical defects in analog integrated circuits, which may be used in accordance with the principles of the present invention.

Referring initially to FIG. 1, illustrated is a partial sectional view of an exemplary embodiment of a system 100 for detecting and analyzing critical defects in analog integrated circuits, which may be used in accordance with the principles of the present invention. It should initially be noted that the system 100 may include many objects, and is not be limited by what is illustrated in the embodiment shown in FIG. 1.

In the embodiment shown in FIG. 1, the system 100 includes a fault testing subsystem 110, an optical inspection subsystem 130, and a correlation subsystem 160. The fault testing subsystem 110, in a preferred embodiment of the invention, may include a probe testing device 125 configured to test power FET portions 120 of analog integrated circuits 115. The embodiment illustrated in FIG. 1 illustrates just one die with a analog integrated circuits 115 having power FETs 120, however it is likely that the testing will be performed on an entire production wafer having a plurality of dies each having analog integrated circuits 115. Also, while the fault testing subsystem 110 of FIG. 1 is illustrated as using the probe testing device 125, it should be noted that it may include other subsystems designed to test for faults in analog integrated circuits 115 without departing from the scope of the present inventions As previously mentioned, the system 100 may further include an optical inspection subsystem 130. The optical inspection subsystem 130, as compared to the fault testing subsystem 110, is configured to perform in-line optical inspections of the analog integrated circuit 115 during different stages of the manufacture thereof. For example, the optical inspection subsystem 130 of FIG. 1 uses a KLA or AIT in-line optical inspection tool 135 to perform in-line analysis of the analog integrated circuit 115 after each layer of the device has been formed. While FIG. 1 illustrates that a KLA or AIT in-line optical inspection tool 135 is used for the aforementioned purpose, those skilled in the art understand that any other known or hereafter discovered in-line optical inspection tool 135 could nonetheless be used.

The system 100 may further include the correlation subsystem 160. The correlation subsystem 160 may include any subsystem capable of accurately comparing information obtained from the fault testing subsystem 110 and the optical inspection subsystem 130. In the embodiment illustrated in FIG. 1, the correlation subsystem 160 includes a computer subsystem 165, possibly including a overlay, layout or circuit analysis tool. The computer subsystem 165 may be coupled to both the fault testing subsystem 110 and the optical inspection subsystem 130 via cables 170, and may be configured to receive and process information from the fault testing subsystem 110 and the optical inspection subsystem 130, respectively.

In one embodiment of the present invention, the computer subsystem 165 may be software residing on a conventional personal computer. The software embodiment includes source code, object code, libraries, executable programs and other software structures that cooperatively function together to achieve the functionality of the present invention. The computer subsystem 165 may also include a monitor 175, a chassis 180 or a keyboard 185. Alternatively, however, the monitor 175 and the keyboard 185 may be replaced by other conventional output and input devices, respectively.

It should be noted that any conventional computer system having at least one CPU that is suitable to function as the computer subsystem 165, including without limitation, hand-held units, laptop/notebooks, minis, mainframes and super-computers, including RISC and parallel processing architectures, as well as combinations of such systems, may be used. Conventional computer system architecture is more fully discussed in *Computer Organization and Architecture*, by William Stallings, MacMillan Publishing Co. (3rd ed. 1993), which is also incorporated herein by reference. Alternative computer system embodiments may be firm-or hardware-based. It should also be noted that the correlation subsystem 160 is not limited to an external source and may be included within a logic provided in the fault testing subsystem 110, the optical inspection subsystem 130, or both. In this embodiment, the fault testing subsystem 110 and the optical inspection subsystem 130 might be coupled directly to one another.

Figure 2:
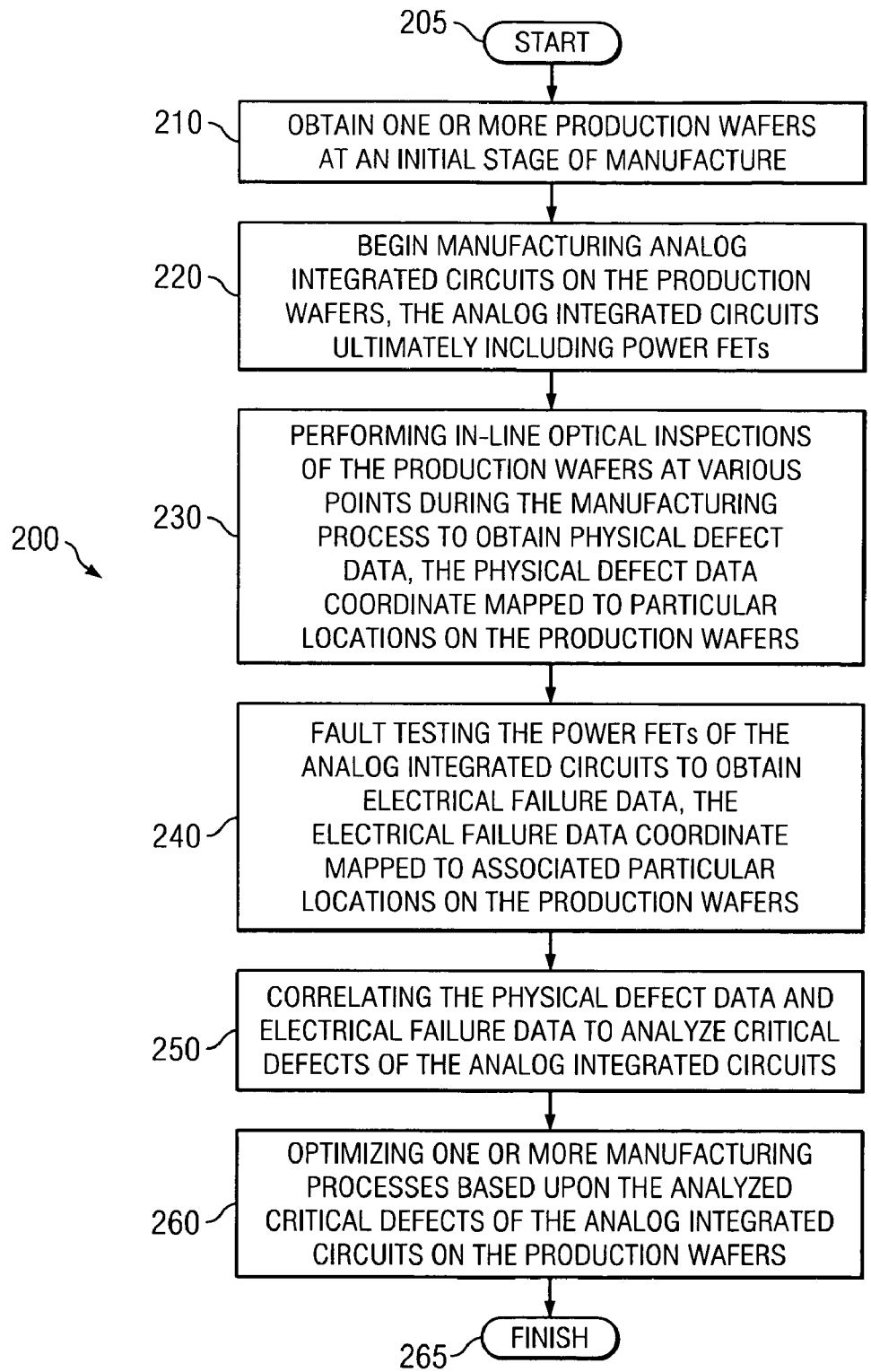
FIG. 2 illustrates a flow diagram of a method for detecting critical defects in analog integrated circuits in accordance with the principles of the present invention.

Turning now to FIG. 2, with continued reference to FIG. 1, illustrated is a flow diagram 200 of a method for detecting critical defects in analog integrated circuits 115. The method for detecting critical defects in accordance with the principles of the present invention, as will be illustrated, may be incorporated into a conventional process flow for manufacturing analog integrated circuits 115. In FIG. 2, the method begins in a step 205. In a step 210, one or more production wafers, as compared to test wafers, may be obtained at an initial stage of manufacture. The production wafers, depending on a number of different factors, may be bare production wafers having no integrated circuit features located thereon, or in an alternative embodiment may be production wafers already having certain integrated circuit features located thereon.

The process continues in a step 220, wherein the production wafers obtained in step 210 are subjected to processing steps, thereby forming integrated circuit features thereon. For example, in step 220 one particular level of the analog integrated circuit 115 might be formed. In another example, however, only portions of the particular level of the analog integrated circuit 115 could be formed.

In a step 230, after forming a predetermined number of integrated circuit features on the production wafer, the optical inspection subsystem 130, and more particularly the in-line optical inspection tool 135, may be employed to obtain physical defect data for the integrated circuit features formed in step 220. As previously mentioned, a plurality of different in-line optical inspection tools 135 are capable of obtaining the physical defect data. Two of the more commonly used in-line optical inspection tools are the KLA and AIT inline optical inspection tools available from KLA Tencor. The in-line optical inspection tool 135 typically provides physical defect data files having a mapped X, Y coordinate location. Accordingly, the physical defect data, typically in the form of an optical image, can be mapped to its position on the production wafer.

In an exemplary embodiment of the present invention, steps 220 and 230 are repeated a plurality of different times. That is, it is often desired that step 230 be repeated after each layer of the analog integrated circuit 115 is completed. Doing the process in this fashion allows the in-line optical inspection tool 135 to gather physical defect data for each layer in the process. Greater information may be gathered this way.

Figure 3A:
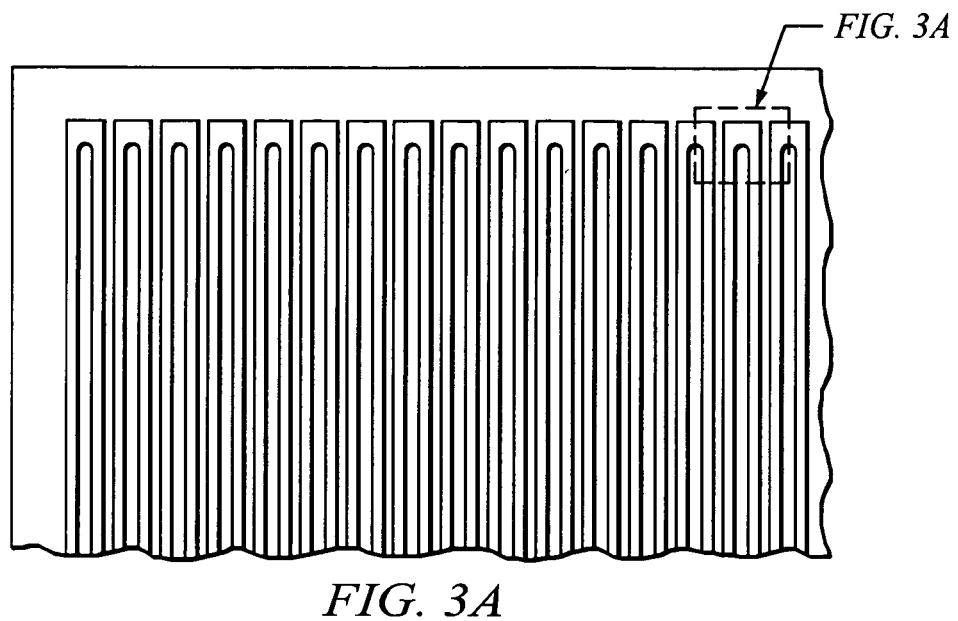
FIGS. 3A-5 illustrate the large area and repeating nature of the physical structure layout (device layout) of the power FET devices.
Figure 3B:
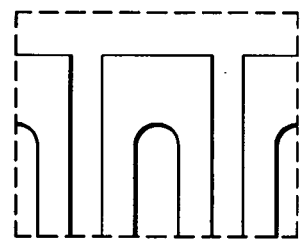
Figure 4:
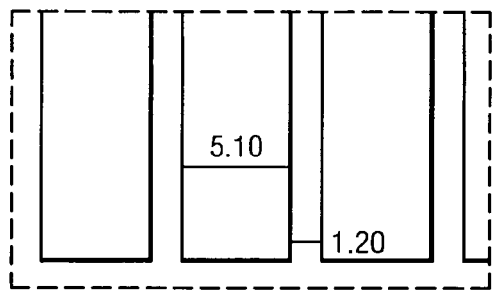
Figure 5:
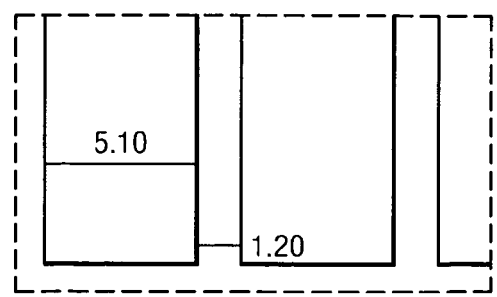

After completing steps 220 and 230, and thus substantially if not entirely completing the manufacture of the analog integrated circuits 115, fault testing of the power FETs 120 (e.g., lateral drain metal oxide semiconductor (LDMOS) transistors, drain extended metal oxide semiconductor (DE-MOS) transistors, etc.) of the analog integrated circuits 115 may be conducted in a step 240. As previously recited, heretofore the industry was not aware that the power FETs 120 of analog integrated circuits 115 could provide accurate and electrical failure data and lend itself to correlation and overlay with physical defect data. The invention recognizes the large area and repeating nature (illustrated in FIGUREs 3A-5) of the physical structure layout (device layout) of the Power PET devices making them available as physical defect discernment vehicles. FIGS. 3A-3B illustrate the repeating nature of the poly spacing. FIG. 4, on the other hand, illustrates an array of Metal-1 traces consisting of about 5 µm lines and about 1.0 µm spaces. FIG. 5 illustrates that the layout of Metal-2, as shown in FIGS. 5, is substantially similar to the layout of Metal-1, at least with respect to lines and spacing. Knowing this, the present invention recognized that at the very least the power FETs 120 could be used to obtain pass/fail electrical failure data, obtain physical defect data, and combined with device layout information use the correlated data to discern Critical Defects (also called Killing Defects or those physical defects which result in electrical failure).

Accordingly, in one embodiment of the present invention, fault testing is performed using the fault testing subsystem 110, and more specifically the probe testing device 125, on each of the power FETs 120 of the analog integrated circuits 115 on the production wafer. The fault testing in this embodiment provides information whether each of the individual power FETs 120 passes or fails the fault testing. Depending on whether the fault test was testing for an open or a closed circuit, and whether the results illustrate an open or a closed circuit, each of the power FETs 120 may be labeled either pass or fail.

Similar to the need for mapping the coordinates of the physical defect data in relation to the production wafer, it is important to map the coordinates of the power FETs 120, and thus the electrical failure data attributed to each of the power FETs 120, in relation to the production wafer. As will be more evident below, the need to map both is related to the desire to overlay the physical defect data and the electrical failure data. Those skilled in the art understand the process that might be used to map the coordinates of each of the power FETs 120, and thus the electrical failure data of each, in relation to the production wafer. For this reason, no further detail will be given. It should nevertheless be noted that the mapping of the physical defect data and the electrical failure data should harmonize with one another to enable direct discernment on a production wafer of an electrical failure resulting from the presence of a physical defect.

After obtaining electrical failure data for a collection, if not all of the power FETs 120 on the production wafer, in a step 250 the electrical failure data obtained from the fault testing subsystem 110 may be correlated to the physical defect data obtained from the optical inspection subsystem 130. This correlation may be performed visually or using software, and is designed to ascertain which defects observed using the in-line inspection are critical defects. The correlation may also be used to categorize the causes of the critical defects.

Depending on the particular embodiment of the present invention, the correlation subsystem 160, and more particularly the software residing on the computer subsystem 165, obtains the physical defect data from the optical inspection subsystem 130 and the electrical failure data from the fault testing subsystem 110 and overlays the two. This overlay is made possible by the definition of a mathematical relation between the physical space in which particle data is measured and the imaginary electrical space in which the electrical failure data is measured. For the purposes of the present invention, the electrical space for the chip may be chosen to correspond with the large power FETs. Each LDMOS structure was designated as a block failure composed of a set number of row and column addresses. The software first converts inspection defects from wafer based physical coordinates to die based physical coordinates and then uses the mathematical relation to assign each inspection defect a single electrical address which for the purposes of this chip will be a single LDMOS structure. As one skilled in the art would appreciate, this overlaying allows the critical defects to be differentiated from the non-critical defects.

This step further includes analyzing the critical defects to obtain useful information. For instance, now that the critical defects are known, the data obtained from the in-line optical inspection tool 135 for each of the critical defects may be used to link each of the critical defects to a particular process or series of processes. For example, given the coordinates of the critical defects and the data obtained from the in-line optical inspection tool 135, failure analysis engineers can use a variety of "physical deprocessing" methods to identify the root cause of the failure, if needed. Based on the failure category, engineers can estimate where in the production process the failure occurred (e.g., the polysilicon layer deposition step, metal one layer deposition step, etc.).

Similarly, the information may be used to tabulate the number of defects caused by each of the production processes or series of production processes. The tabulated results may then be used to determine what production process or series of production processes cause the most critical defects.

Figure 6:
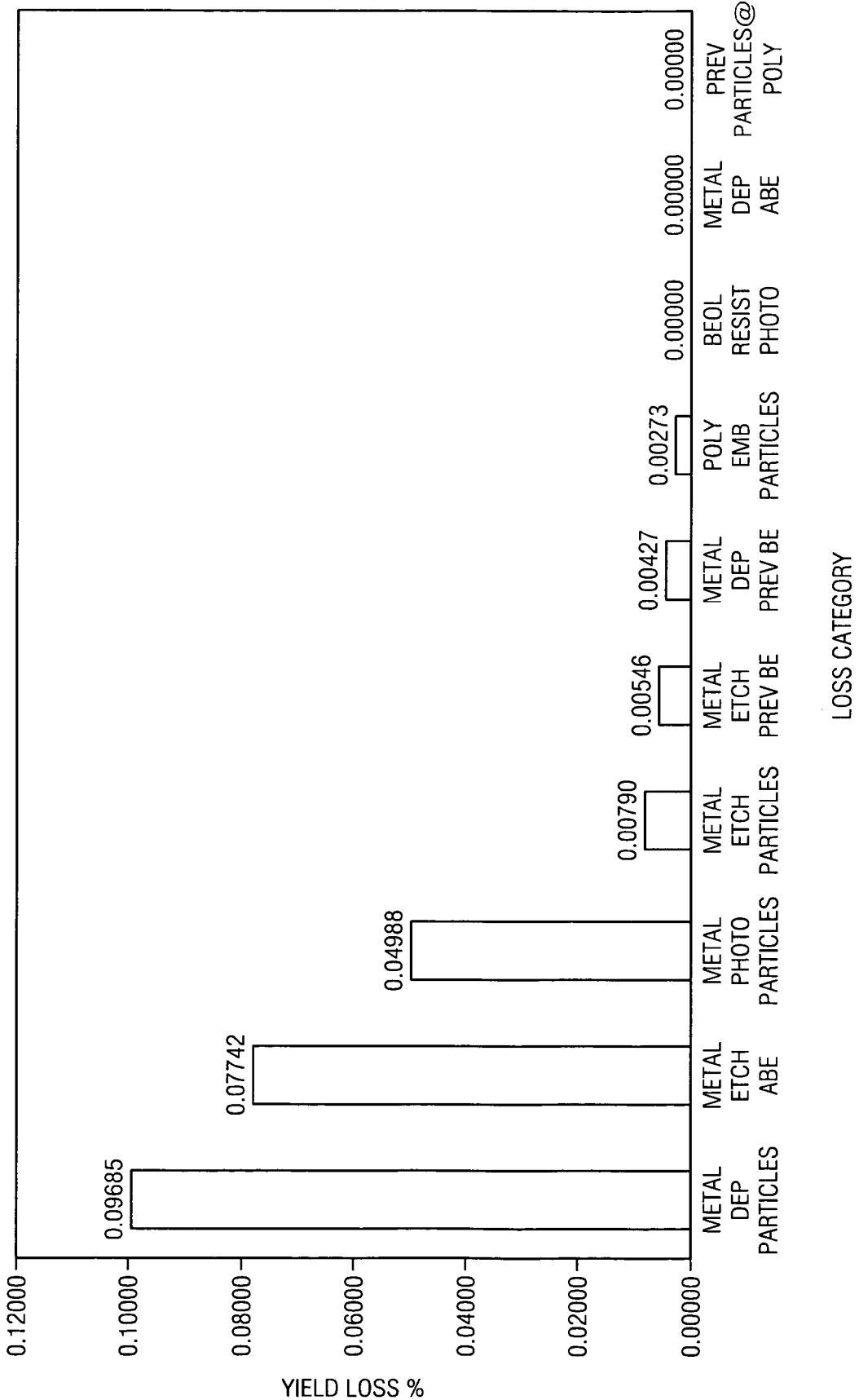
FIG. 6 illustrates a production pareto from production wafers using the aspects of the present invention.

Thereafter, in a step 260, one or more of the production processes may be optimized using the analyzed critical defects of the analog integrated circuits. In an exemplary situation, the production processes are optimized in order of importance based upon the tabulated results disclosed above, such as shown in FIG. 6, which illustrates a production pareto from production wafers using the aspects of the present invention. The information, such as the production pareto, allows the production engineers to focus on the production processes causing the most number of critical defects. The process would then stop in a finish step 265, or repeat itself by returning to step 205 with a new set of production wafers.

Accordingly, the present invention provides a number of advantages not experienced by the conventional testing of analog integrated circuits. First and probably foremost, the present invention allows for a 1:1 discernment of an electrical failure at probe to a specific physical defect (in-line). This information was not previously attainable using the test wafer methodology previously used in testing analog integrated circuits. Further, the present invention allows for the fast and flexible matching of data to enable defect analysis by time, process layer, defect size, defect classification, etc. This, as one would expect, allows production engineers to address and remedy top yield killing defects that typically greatly reduce the production yield of analog integrated circuits.

Although the present invention has been described in detail, those skilled in the art should understand that they can make various changes, substitutions and alterations herein without departing from the spirit and scope of the invention in its broadest form.

The invention claimed is:

1. A method for analyzing critical defects in analog integrated circuits, comprising;
   fault testing a power field effect transistor portion of an analog integrated circuit to obtain electrical failure data;
   performing an in-line optical inspection of the analog integrated circuit to obtain physical defect data;
   correlating the electrical failure data and physical defect data to analyze critical defects.

2. The method as recited in claim 1 wherein the power field effect transistor portion is a lateral drain metal oxide semiconductor (LDMOS) transistor.

3. The method as recited in claim 1 wherein the power field effect transistor portion is a drain extended metal oxide semiconductor (DE-MOS) transistor.

4. The method as recited in claim 1 wherein correlating the electrical failure data and physical defect data includes producing an overlay of the electrical failure data and the physical defect data.

5. The method as recited in claim 4 wherein the overlay is visual.

6. The method as recited in claim 4 wherein coordinates of the electrical failure data is mapped in relation to the analog integrated circuit and the coordinates of the physical defect data is mapped in relation to the associated integrated circuit, and wherein the coordinates of each are used to overlay the electrical failure data and physical defect data.

7. The method as recited in claim 1 further including inputting the electrical failure data and physical defect data into an overlay analysis tool then correlating the electrical failure data and physical defect data using the overlay analysis tool.

8. The method as recited in claim 7 wherein the overlay analysis tool includes software on a computer.

9. The method as recited in claim 1 wherein fault testing includes probe testing to determine whether the power field effect transistor passes or fails.

10. The method as recited in claim 1 wherein performing an in-line optical inspection includes performing an in-line optical inspection using a KLA or AIT in-line optical inspection tool.

11. The method as recited in claim 1 wherein the fault testing and performing are conducted on a wafer including a plurality of dies each having integrated circuits.

12. The method as recited in claim 11 wherein the wafer is a production wafer and not a test wafer.

13. The method as recited in claim 1 further including linking each analyzed critical defects to a particular production process or series of production processes.

14. The method as recited in claim 13 further including tabulating the number of analyzed critical defects linked to each particular process step or series of steps.

15. The method as recited in claim 14 further including optimizing one or more particular process steps or series of steps in order of importance based upon the tabulated number of analyzed critical defects linked to each particular process step or series of steps.

16. A system for analyzing critical defects in analog integrated circuits, comprising;
   a fault testing subsystem configured to test a power field effect transistor portion of an analog integrated circuit to obtain electrical failure data;
   an optical inspection subsystem configured to perform an in-line optical inspection of the analog integrated circuit to obtain physical defect data;
   a correlation subsystem configured to correlate the electrical failure data and physical defect data to analyze critical defects.

17. The system as recited in claim 16 wherein the correlation subsystem resides on a computer subsystem.

18. The system as recited in claim 16 wherein the correlation subsystem resides within the fault testing subsystem or the optical inspection subsystem.

19. The system as recited in claim 16 wherein the power field effect transistor portion is a lateral drain metal oxide semiconductor (LDMOS) transistor and the fault testing subsystem is configured to test the lateral drain metal oxide semiconductor (LDMOS) transistor.

20. A method for analyzing critical defects in analog integrated circuits, comprising;
   fault testing a power field effect transistor portion of an analog integrated circuit to obtain electrical failure data;
   performing an in-line optical inspection of the analog integrated circuit to obtain physical defect data;
   correlating the electrical failure data and physical defect data by producing a visual overlay of the electrical failure data and the physical defect data to analyze critical defects, wherein coordinates of the electrical failure data are mapped in relation to the analog integrated circuit and the coordinates of the physical defect data are mapped in relation to the associated integrated circuit.

* * * * *